United States Patent
Bayram et al.

(10) Patent No.: US 8,927,398 B2
(45) Date of Patent: Jan. 6, 2015

(54) GROUP III NITRIDES ON NANOPATTERNED SUBSTRATES

(71) Applicant: International Business Machines Corporation, Armonk, NY (US)

(72) Inventors: Can Bayram, Ossining, NY (US); Devendra K. Sadana, Pleasantville, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 13/734,436

(22) Filed: Jan. 4, 2013

(65) Prior Publication Data

US 2014/0191283 A1 Jul. 10, 2014

(51) Int. Cl.
| | |
|---|---|
| *H01L 21/36* | (2006.01) |
| *H01L 21/20* | (2006.01) |
| *H01L 29/20* | (2006.01) |
| *H01L 29/267* | (2006.01) |

(52) U.S. Cl.
CPC .......... *H01L 29/267* (2013.01); *H01L 21/2003* (2013.01); *H01L 29/2003* (2013.01)
USPC ........... 438/489; 438/483; 438/503; 438/509; 438/767; 257/E21.131

(58) Field of Classification Search
None
See application file for complete search history.

(56) References Cited

U.S. PATENT DOCUMENTS

| | | | | |
|---|---|---|---|---|
| 2002/0090816 | A1* | 7/2002 | Ashby et al. | 438/686 |
| 2006/0246636 | A1* | 11/2006 | Imai et al. | 438/149 |
| 2008/0272396 | A1* | 11/2008 | Fournel et al. | 257/190 |

OTHER PUBLICATIONS

Lee et al. ("Orientation-dependent nucleation of GaN on a nanoscale faceted Si surface," Journal of Crystal Growth 279, pp. 289-292, 2005).*

Davis, R. F., et al., "Conventional and pendeo-epitaxial growth of GaN(0 0 0 1) thin films on Si(1 1 1) substrates", Journal of Crystal Growth, Oct. 2001, 231, pp. 335-341.

Honda, Y., et al., "Growth of GaN free from cracks on a ,, 111 . . . Si substrate by selective metalorganic vapor-phase epitaxy", Applied Physics Letters, Jan. 14, 2002, vol. 80, No. 2.

(Continued)

*Primary Examiner* — Yasser A Abdelaziez
(74) *Attorney, Agent, or Firm* — Scully, Scott, Murphy & Presser, P.C.; Louis J. Percello, Esq.

(57) ABSTRACT

A patterned substrate is provided having at least two mesa surface portions, and a recessed surface located beneath and positioned between the at least two mesa surface portions. A Group III nitride material is grown atop the mesa surface portions of the patterned substrate and atop the recessed surface. Growth of the Group III nitride material is continued merging the Group III nitride material that is grown atop the mesa surface portions. When the Group III nitride material located atop the mesa surface portions merge, the Group III nitride material growth on the recessed surface ceases. The merged Group III nitride material forms a first Group III nitride material structure, and the Group III nitride material formed in the recessed surface forms a second material structure. The first and second material structures are disjoined from each other and are separated by an air gap.

20 Claims, 5 Drawing Sheets

(56) References Cited

OTHER PUBLICATIONS

Kawaguchi, Y., et al., "Selective Area Growth of GaN on Stripe-Patterned (111)Si Substrate by Metalorganic Vapor Phase Epitaxy", Phys. Stat. Sol., Nov. 1999, (a) 176, 553.

Kim, K.-J., et al., "Growth of Crack-Free GaN/Si Heteroepitaxy by Using a Patterned Si Substrate Method", Journal of the Korean Physical Society, Apr. 2005, vol. 46, No. 4, pp. 901-905.

Lee, S.-J., et al., "Epitaxial Growth of Crack-Free GaN on Patterned Si(111) Substrate", Japanese Journal of Applied Physics, Apr. 2008, vol. 47, No. 4, pp. 3070-3073.

Wang, D. et al., "Characterization of GaN grown on patterned Si(1 1 1) substrates", Journal of Crystal Growth, Jan. 2004, 272, pp. 489-495.

Yang, Z., et al., "GaN-on-patterned-silicon (GPS) technique for fabrication of GaN-based MEMS", Sensors and Actuators A, Aug. 14, 2006, 130-131, pp. 371-378.

U.S. Appl. No. 13/677,997, filed Nov. 15, 2012, entitled "Selective Gallium Nitride Regrowth on (100) Silicon", first named inventor: Can Bayram.

U.S. Appl. No. 13/677,954, filed Nov. 15, 2012, entitled "Dual Phase Gallium Nitride Material Formation on (100) Silicon", first named inventor: Can Bayram.

* cited by examiner

FIG. 9

GROUP III NITRIDES ON NANOPATTERNED SUBSTRATES

BACKGROUND

The present disclosure generally relates to a method of forming a Group III nitride structure on a substrate, and more particularly to a method of forming a planar Group III nitride material structure on a patterned substrate. The present disclosure also relates to a semiconductor structure including a Group III nitride material structure which has a planar uppermost surface and a corrugated bottommost surface.

Group III nitride materials are a unique group of semiconductor materials which can be used in a wide variety of applications including, for example, optoelectronics, photovoltaics and lighting. Group III nitride materials are composed of nitrogen and at least one element from Group III, i.e., aluminum (Al), gallium (Ga) and indium (In), of the Periodic Table of Elements. Illustrative examples of some common Group III nitrides are AlN, InN, GaN, GaAlN, and GaAlInN. By changing the composition of Al, Ga and/or In within a Group III nitride material, the Group III nitride material can be tuned along the electromagnetic spectrum; mainly from 210 nm to 1770 nm. This spectrum includes the visible light emitting diode (LED), which is more than a 10 billion dollar industry with a forecasted double digit yearly growth rate. This continuous growth in LED demand enables the infrastructural build-up for the growth and fabrication of Group III nitride based semiconductor devices.

For GaN integration on silicon, there is a large lattice mismatch value between those two types of semiconductor materials. As such, thick (on the order of 2-3 μm) strain-compensation buffer layers are grown on silicon prior to device formation. Such buffer deposition requires temperature cycling so as to maintain the stain level of the gallium nitride material which increases the growth time and wastes materials. This "thick and engineered" buffer layered approach increases the cost and is one of the main bottlenecks for forming epitaxial gallium nitride materials on silicon substrates.

In view of the above, there is a need for providing a method for epitaxial forming a Group III nitride material on a surface of a silicon substrate that avoids the formation of the "thick and engineered" buffer layers and thus reduces the cost of forming epitaxial Group III nitride materials on silicon substrates.

SUMMARY

A substrate is provided and patterned to have at least two mesa surface portions, and a recessed surface located beneath and positioned between the at least two mesa surface portions. An optional buffer layer is then formed on exposed surfaces of the patterned substrate. A Group III nitride material is then grown atop the at least two mesa surface portions of the patterned substrate and atop the recessed surface. Growth of the Group III nitride material is continued merging the Group III nitride material that is grown atop the at least two mesa surface portions. When the Group III nitride material that is grown atop the at least two mesa surface portions merge, the Group III nitride material growth on the recessed surface ceases. The merged Group III nitride material forms a first Group III nitride material structure, and the Group III nitride material formed in the recessed surface forms a second Group III nitride material structure. The first and second Group III nitride material structures are disjoined from each other and are separated by an air gap.

The air gap provides a stress mechanism that prevents cracks in the first Group III nitride material structure. Also, the first Group III nitride material structure has a planar uppermost surface following the merging of the Group III nitride material that is grown atop the at least two mesa surface portions.

In one aspect of the present disclosure, a method of forming a semiconductor structure is provided. The method of the present disclosure includes providing a patterned substrate comprising at least two mesa surface portions and at least one recessed opening separating the at least two mesa surface portions. Next, a first Group III nitride material structure and a second Group III nitride material structure are simultaneously formed. In accordance with the present disclosure, the first Group III nitride material structure is formed atop the at least two mesa surface portions of the patterned substrate and spans across the at least one recessed opening, and the second Group III nitride material structure is formed entirely in the at least one recessed opening, and is disjoined from the first Group III nitride material structure, and is atop a recessed surface of the patterned substrate.

In another aspect of the present disclosure, a semiconductor structure is provided. The semiconductor structure of the present disclosure includes a Group III nitride material structure comprising a Group III nitride material and having a planar uppermost surface and a corrugated bottommost surface opposing the planar uppermost surface. In accordance with the present disclosure, the corrugated bottommost surface of the Group III nitride material structure comprises at least two non-indented portions, and has an indented portion located between the at least two non-indented portions.

DETAILED DESCRIPTION

The present disclosure will now be described in greater detail by referring to the following discussion and drawings that accompany the present disclosure. It is noted that the drawings are provided for illustrative purposes only and are not drawn to scale. It is further noted that like elements shown in the drawings are referred to by like reference numerals.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
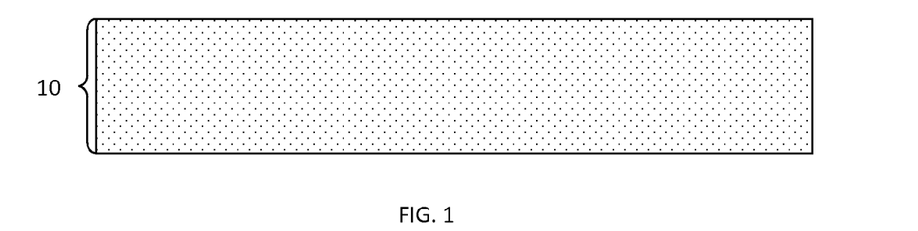
FIG. 1 is a pictorial representation (through a cross sectional view) illustrating a substrate that can be employed in one embodiment of the present disclosure.

Referring first to FIG. 1, there is illustrated a substrate 10 that can be employed in one embodiment of the present disclosure. The substrate 10 that is employed at this point of the present disclosure has a planar uppermost surface and a planar bottommost surface. In some embodiments of the present disclosure, the substrate 10 can comprise a single material having unitary construction. In another embodiment of the present disclosure, the substrate 10 can comprise two or more different materials stacked one atop the other. The substrate 10 or at least an upper portion of the substrate 10 comprises a material in which a Group III nitride material layer can be subsequently formed thereon by metalorganic chemical vapor (MOCVD). Thus, substrate 10 can also be referred to herein as a Group III nitride material growth substrate.

In one embodiment of the present disclosure, substrate 10 can comprise a semiconductor material including for example, (111) silicon, silicon carbide, a Group III nitride material, and a multilayered stack thereof. For example, substrate 10 can comprise a multilayered stack of, from bottom to top, a layer of silicon and an epitaxially grown Group III nitride. The term "Group III nitride" as used throughout the present disclosure denotes a compound of nitrogen and at least one element from Group III, i.e., aluminum (Al), gallium (Ga) and indium (In), of the Periodic Table of Elements. Illustrative examples of some Group III nitride materials that can be employed as substrate 10 include, but are not limited to, GaN, AlN, AlGaN, GaAlN, and GaAlInN. In another embodiment of the present disclosure, substrate 10 can comprise sapphire, i.e., $Al_2O_3$.

When substrate 10 is comprised of a semiconductor material, the semiconductor material that can be employed in the present disclosure is typically a single crystalline material and may be doped, undoped or contain regions that are doped and other regions that are non-doped. The dopant may be an n-type dopant selected from an Element from Group VA of the Periodic Table of Elements (i.e., P, As and/or Sb) or a p-type dopant selected from an Element from Group IIIA of the Periodic Table of Elements (i.e., B, Al, Ga and/or In). The substrate 10 may contain one region that is doped with a p-type dopant and other region that is doped with an n-type dopant.

The substrate 10 can have a thickness from 5 microns to 2 cm. Thicknesses that are greater than or lesser than the aforementioned thickness range can also be used for the substrate 10.

Figure 2:
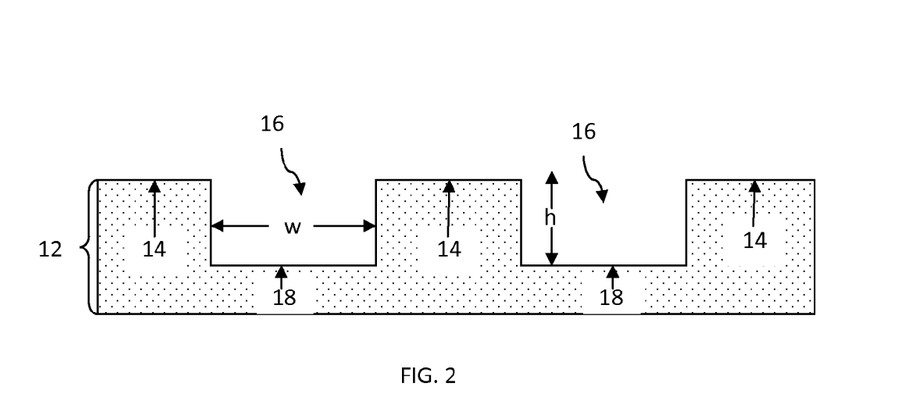
FIG. 2 is a pictorial representation (through a cross sectional view) illustrating the substrate of FIG. 1 after patterning the substrate to provide a patterned substrate that includes at least two mesa surface portions and at least one recessed opening separating the at least two mesa surface portions.

Referring now to FIG. 2, there is illustrated the substrate of FIG. 1 after patterning the substrate 10 to provide a patterned substrate 12 that includes at least two mesa surface portions 14 and at least one recessed opening 16 separating the at least two mesa surface portions 14.

At the bottom of the at least one recessed opening 16 there is present a recessed surface 18 of the patterned substrate 12. The recessed surface 18 of the patterned substrate 12 is vertically offset and located beneath the at least two mesa surface portions 14. The recessed surface 18 of the patterned substrate 12 is also parallel to the at least two mesa surface portions 14. As such, the recessed surface 18 of the patterned substrate 12 is within a same crystal plane as that of the least two mesa surface portions 14. For example, and when substrate 10 is composed of (111) Si, the recessed surface 18 of the patterned substrate 12 is within the (111) crystal plane family as that of the least two mesa surface portions 14 which have a (111) crystal surface orientation. It is noted that the sidewalls of the at least one recessed opening 16 are in a different crystal plane family as that of the recessed surface 18 and the least two mesa surface portions 14 of patterned substrate 12.

The substrate 10 can be patterned by lithography and etching. The lithographic process can include forming a photoresist (not shown) atop substrate 10, exposing the photoresist to a desired pattern of radiation and developing the exposed photoresist utilizing a conventional resist developer. The pattern is then transferred into the substrate 10 by etching. The etching can include a dry etching process (such as, for example, reactive ion etching, ion beam etching, plasma etching or laser ablation), and/or a wet chemical etching process. Typically, reactive ion etching is used to transfer the pattern from the developed photoresist into the substrate 10. After patterning the substrate 10, the patterned photoresist can be removed utilizing a conventional stripping process such as, for example, ashing.

In some embodiments (not shown), a blanket layer of hard mask material can be formed directly on an uppermost surface of the substrate 10 prior to patterning. The blanket layer of hard mask is a continuous layer that covers the entirety of the uppermost surface of the substrate 10. The blanket layer of hard mask material can include an oxide, a nitride, an oxynitride or any multilayered combination thereof. In one embodiment, the hard mask material is an oxide such as silicon oxide, while in another embodiment the hard mask is a nitride such as silicon nitride. The blanket layer of hard mask material can be formed utilizing a conventional deposition process including, for example, chemical vapor deposition (CVD), plasma enhanced chemical vapor deposition (PECVD), chemical solution deposition, evaporation, and physical vapor deposition (PVD). Alternatively, the hard mask can be formed by one of thermal oxidation, and thermal nitridation. The thickness of the blanket layer of hard mask material is from 5 nm to 100 nm. Other thicknesses that are greater than or lesser than the thickness range mentioned above can also be employed for the blanket layer of hard mask material.

After forming the blanket layer of hard mask material, the lithographic and etching processes mentioned above are performed and after transferring the pattern into the substrate 10, the patterned photoresist and the patterned hard mask can be removed. The patterned hard mask is removed in a separate step from the step used to remove the patterned photoresist and one of chemical mechanical polishing (CMP) and/or grinding may be used to remove the patterned hard mask from the patterned substrate 12.

In one embodiment, the at least one recessed opening 16 that is formed between the at least two mesa surface portions 14 has a width, w, as measured from one vertical sidewall of the opening to the other vertical sidewall of the opening, of from 10 nm to 400 nm. In another embodiment, the at least one recessed opening 16 that is formed between the at least two mesa surface portions 14 has a width, w, as measured from one vertical sidewall of the opening to the other vertical sidewall of the opening, of from 1 μm to 10 μm. In one embodiment of the present disclosure the height, h, of the at least one recessed opening 16, as measured from the recessed surface 18 to the original uppermost surface of substrate 10, is from 10 nm to 1000 nm. In another embodiment of the present disclosure the height, h, of the at least one recessed opening 16, as measured from the recessed surface 18 to the original uppermost surface of substrate 10, is from 500 nm to 10000 nm.

In accordance with an embodiment of the present disclosure, the aspect ratio (i.e., ratio between the height and width) of the at least one recessed opening 16 is from 1 to 10. In accordance with another embodiment of the present disclosure, the aspect ratio (i.e., ratio between the height and width) of the at least one recessed opening 16 is from 10 to 100. It is noted that the inventors of the present disclosure have determined through experimentation that by providing a recessed opening in substrate 10 that falls within one of the aforementioned aspect ratio ranges, one can selectively promote the growth of a Group III nitride material on the two mesa surface portions 14 of the patterned substrate 12, rather than sidewalls and recessed surface 18 of the patterned substrate 12.

In some embodiments of the present disclosure, particularly when the substrate 10 includes (111) Si, the patterned substrate 12 that is shown in FIG. 2 may be heated in a hydrogen atmosphere and then a prealuminization process is performed which stabilizes the surfaces of the silicon substrate. These steps are performed prior to forming a buffer layer, and prior to forming the Group III nitride material.

The heating of the patterned substrate 12 shown in FIG. 2 in a hydrogen atmosphere includes placing the structure into a reactor chamber of a metalorganic chemical vapor deposition (MOCVD) apparatus. MOCVD can be performed with or without a plasma enhancement provision. In some embodiments, and prior to placing the patterned substrate 12 shown in FIG. 2 into the MOCVD reactor chamber, the patterned substrate 12 can be cleaned using an HF cleaning process. The MOCVD reactor chamber including the patterned substrate 12 shown in FIG. 2 is then evacuated to a pressure of about 50-100 mbar or less and then a hydrogen atmosphere is introduced into the reactor chamber. In some embodiments, the pressure within the MOCVD reactor is at atmospheric, i.e., 760 mbar. The hydrogen atmosphere may include pure hydrogen or hydrogen admixed with an inert carrier gas such as, for example, helium and/or argon. When an admixture is employed, hydrogen comprises at least 25% or greater of the admixture, the remainder of the admixture (up to 100%) is comprised of the inert carrier gas.

With the hydrogen atmosphere present in the reactor chamber, the structure is heated to a temperature of about 900° C. or less. In one embodiment, the temperature in which the patterned substrate 12 shown in FIG. 2 is heated under the hydrogen atmosphere is from 500° C. to 600° C. In another embodiment, the temperature in which the patterned substrate 12 shown in FIG. 2 is heated under the hydrogen atmosphere is from 600° C. to 900° C. Notwithstanding the temperature in which the patterned substrate 12 of FIG. 2 is heated under the hydrogen atmosphere, the heating is performed for a time period of 5 minutes to 20 minutes. This step of the present disclosure is believed to clean the surfaces and hydrogenate the exposed surfaces of the patterned substrate, which may be particularly useful when a (111) silicon substrate is employed. In some embodiments, the heating under hydrogen can be replaced with heating under an inert gas.

Since most Group III elements will react directly with silicon, a prealuminization step is typically performed to stabilize the silicon nucleation sites prior to forming the Group III nitride material; no Al layer is formed during this step of the present disclosure. The prealuminization step can be performed by introducing an organoaluminum precursor such as, for example, a trialkylaluminum compound, wherein the alkyl contains from 1 to 6 carbon atoms, into the reactor chamber. Examples of trialkylaluminum compounds that can be employed in the present disclosure, include, but are not limited to, trimethylaluminum, triethylaluminum, and tributylaluminum. The organoaluminum precursor can be introduced in the reactor chamber of the MOCVD apparatus neat, or it can be admixed with an inert carrier gas. The prealuminization step is typically performed at a temperature of 450° C. or greater. In one embodiment, the introducing of the organoaluminum precursor typically occurs at a temperature from 500° C. to 600° C. In another embodiment, the introduction of the organoaluminum precursor occurs at a temperature from 600° C. to 900° C. Notwithstanding the temperature in which the organoaluminum precursor is introduced into the reactor chamber, the prealuminization is performed for a time period of 5 seconds to 120 seconds.

Figure 3:
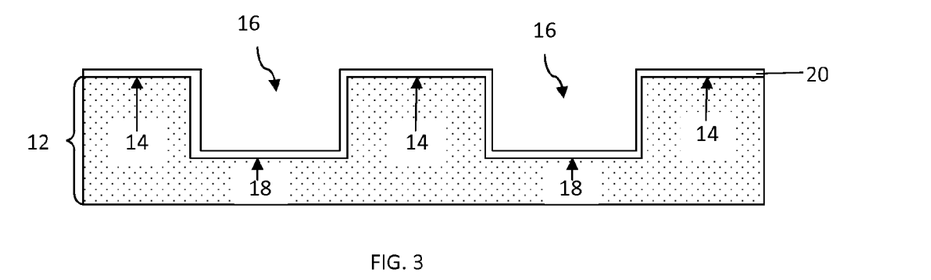
FIG. 3 is a pictorial representation (through a cross sectional view) illustrating the patterned substrate of FIG. 2 after forming a buffer layer on exposed surfaces of the patterned substrate.

Referring now to FIG. 3, there is illustrated the patterned substrate 12 of FIG. 2 after forming a buffer layer 20 on exposed surfaces of the patterned substrate 12. As shown, the buffer layer 20 is a contiguous layer that has a first horizontal portion located on the at least two mesa surface portions 14 of the patterned substrate 12, and a second horizontal portion that is located on the recessed surface 18 of the patterned substrate 12. The first horizontal portion of the buffer layer 20 and the second horizontal portion of the buffer layer 20 are continuously linked to each other by vertical portions of the buffer layer 20 that are formed on each vertical sidewall within the at least one recessed opening 16. In some embodiments, especially, when gallium nitride itself is used as the substrate 10, the step of buffer layer formation can be eliminated.

The buffer layer 20 that can be formed at this point of the present disclosure is any Group III nitride material which varies depending on the type of patterned substrate 12 material in which the Group III nitride material will be subsequently formed. For example, and when the patterned substrate 12 is composed of silicon, buffer layer 20 is typically comprised of AlN. When the patterned substrate 12 is comprised of either sapphire or SiC, buffer layer 20 can be comprised of AlN, GaN, or AlGaN. When the patterned substrate 12 is comprised of GaN, no buffer layer need be employed.

Buffer layer 20 is formed by introducing an organo-Group III element containing precursor such as, for example, an organoaluminum precursor (i.e., a trialkylaluminum compound as mentioned above) or an organogallium precursor (i.e., a trialkylgallium compound) or a mixture thereof, and a nitride precursor such as, for example, ammonium nitride into the reactor chamber of the MOCVD apparatus. MOCVD may be carried out with or without a plasma enhancement provision. An inert carrier gas may be present with one of the precursors used in forming the buffer layer 20, or an inert carrier gas can be present with both the precursors used in forming the buffer layer 20. The buffer layer 20 is typically formed at a temperature of 500° C. or greater. In one embodiment, the deposition of the buffer layer 20 typically occurs at a temperature from 650° C. to 850° C. In another embodiment, the deposition of the buffer layer 20 typically occurs at a temperature from 850° C. to 1050° C. Notwithstanding the temperature in which the buffer layer 20 is formed, the deposition of the buffer layer 20 is performed for a time period of 1 minute to 20 minutes. The buffer layer 20 that is formed typically has a thickness from 10 nm to 250 nm, with a thickness from 60 nm to 80 nm being even more typical.

Figure 4:
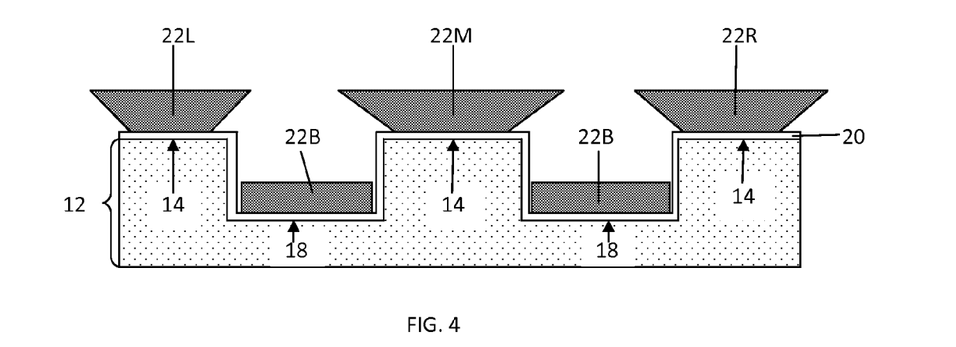
FIG. 4 is a pictorial representation (through a cross sectional view) illustrating the structure of FIG. 3 after an initial stage of growing a Group III nitride material from exposed horizontal portions of the buffer layer.
Figure 5:
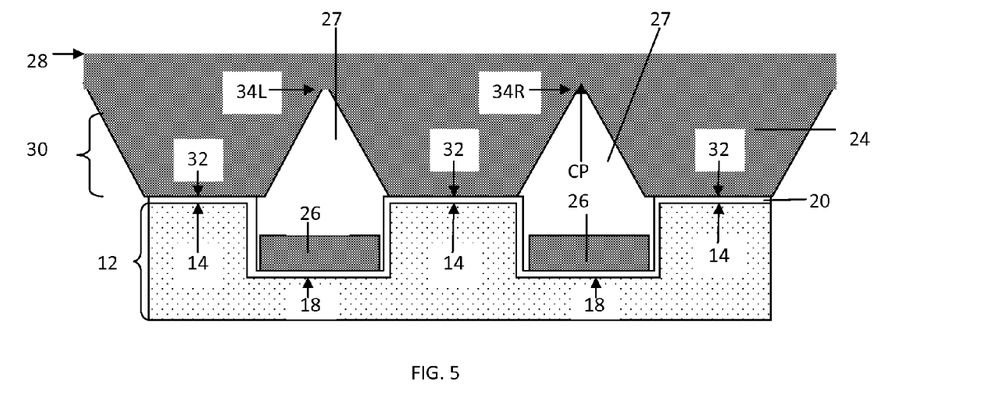
FIG. 5 is a pictorial representation (through a cross sectional view) illustrating the structure of FIG. 4 after complete growth of the Group III nitride material from exposed horizontal portions of the buffer layer in which a first Group III nitride material structure is formed atop the at least two mesa surface portions of the patterned substrate and spans across the at least one recessed opening, and a second Group III nitride material structure is formed in the at least one recessed opening and atop a recessed surface of the patterned substrate.

Referring now to FIG. 4, there is illustrated the structure of FIG. 3 after an initial stage of growing a Group III nitride material 22L, 22M, 22R, 22B from exposed horizontal portions of the buffer layer 20, while FIG. 5 illustrates the structure of FIG. 4 after complete growth of the Group III nitride material 22L, 22M, 22R, 22B from exposed horizontal portions of the buffer layer 20 in which a first Group III nitride material structure 24 is formed atop the at least two mesa surface portions 14 of the patterned substrate 12 and spans across the at least one recessed opening 16, and a second Group III nitride material structure 26 is formed in the at least one recessed opening 16 and atop the recessed surface 18 of the patterned substrate 12.

The term "Group III nitride material" as used throughout the present disclosure to denote a compound that is composed of nitrogen and at least one element from Group III, i.e., aluminum (Al), gallium (Ga) and indium (In), of the Periodic Table of Elements. Illustrative examples of some common Group III nitrides are AlN, InN, GaN, GaAlN, and GaAlInN. In one embodiment of the present disclosure, the Group III nitride material that is formed in the present disclosure is a gallium nitride material such as gallium nitride (GaN), GaAlN, GaInN, and GaAlInN. In another embodiment of the present disclosure, the Group III nitride material that is formed in the present disclosure is an aluminum nitride material such as aluminum nitride (AlN), AlGaN, AlInN, and AlGaInN.

The first Group III nitride material structure 24 is formed when the Group III nitride material 22L and 22M and/or 22M and 22R that are present atop the two mesa surfaces 14 merge. That is, during growth of the Group III nitride material, the Group III nitride material 22L and 22M and/or 22M and 22R have fronts which meet and coalesce forming a Group III nitride material structure of a unitary structure atop the mesa surface portions of the patterned substrate. When the Group III nitride material 22L and 22M and/or 22M and 22R merge, the gallium material growth on the recessed surface 18 ceases. Thus, the second Group III nitride material structure 26 comprising Group III nitride material 22B is located entirely in the at least one recessed opening 16. As shown, the first Group III nitride material 24 is disjoined from the second Group III nitride material structure 26 and an air gap 27 separates the first Group III nitride material structure 24 from the second Group III nitride material structure 26.

In one exemplary embodiment of the present disclosure, the Group III nitride material 22L, 22M, 22R, 22B (and the resultant first and second Group III nitride material structures 24, 26) is pure gallium nitride. In another exemplary embodiment of the present disclosure, the Group III nitride material 22L, 22M, 22R, 22B (and the resultant first and second Group III nitride material structures 24, 26) comprises gallium nitride that includes at least one other Group III element such as, for example, Al and/or In. In such an embodiment, the Group III nitride material 22L, 22M, 22R, 22B (and the resultant first and second Group III nitride material structures 24, 26) may comprise GaAlN, GaInN or GaAlInN. In yet another exemplary embodiment of the present disclosure, the Group III nitride material 22L, 22M, 22R, 22B (and the resultant first and second Group III nitride material structures 24, 26) is pure aluminum nitride. In a further exemplary embodiment of the present disclosure, the Group III nitride material 22L, 22M, 22R, 22B (and the resultant first and second Group III nitride material structures 24, 26) comprises aluminum nitride that includes at least one other Group III element such as, for example, Ga and/or In. Notwithstanding the composition of the Group III nitride material 22L, 22M, 22R, 22B (and the resultant first and second Group III nitride material structures 24, 26), the Group III nitride material 22L, 22M, 22R, 22B (and the resultant first and second Group III nitride material structures 24, 26) is single crystal.

The Group III nitride material 22L, 22M, 22R, 22B (and the resultant first and second Group III nitride material structures 24, 26) of the present disclosure includes introducing at least one organo-Group III element containing precursor and a nitride precursor such as, for example, ammonium nitride into the reactor chamber of the MOCVD apparatus. MOCVD may be carried out with or without a plasma enhancement provision. Examples of organogallium precursors that can be employed in the present disclosure include trialkylgallium compounds such as, for example, trimethylgallium and triethylgallium. Examples of organoaluminum precursors that can be employed in the present disclosure include trialkylaluminum compounds such as, for example, trimethylaluminum and triethlyaluminum. Similar precursors can be used for other types of Group III nitrides.

An inert carrier gas may be present with one of the precursors used in forming the Group III nitride material 22L, 22M, 22R, 22B (and the resultant first and second Group III nitride material structures 24, 26), or an inert carrier gas can be present with both the precursors used in forming the Group III nitride material 22L, 22M, 22R, 22B (and the resultant first and second Group III nitride material structures 24, 26).

The deposition of the Group III nitride material 22L, 22M, 22R, 22B (and the resultant first and second Group III nitride material structures 24, 26) is typically performed at a temperature of 750° C. or greater. In one embodiment, the deposition of the Group III nitride material 22L, 22M, 22R, 22B (and the resultant first and second Group III nitride material structures 24, 26) typically occurs at a temperature from 900° C. to 1200° C. In another embodiment, the deposition of the Group III nitride material 22L, 22M, 22R, 22B (and the resultant first and second Group III nitride material structures 24, 26) typically occurs at a temperature from 1200° C. to 1400° C. Notwithstanding the temperature in which the Group III nitride material 22L, 22M, 22R, 22B (and the resultant first and second Group III nitride material structures 24, 26) is formed, the deposition of the Group III nitride material 22L, 22M, 22R, 22B (and the resultant first and second Group III nitride material structures 24, 26) is performed for a time period of 1 minute to 2 hours.

The resultant first Group III nitride material structure 24 that is formed has a first thickness that is typically from 100 nm to 5000 nm, with a thickness from 500 nm to 1000 nm being even more typical. The resultant second Group III nitride material structure 26 that is formed has a second thickness that is typically less than the first thickness of the first Group III nitride material structure 24. In one embodiment of the present disclosure, the resultant second Group III nitride material structure 26 has a second thickness that is from 500 nm to 1500 nm. In another embodiment of the present disclosure, the resultant second Group III nitride material structure 26 has a second thickness that is from 1000 nm to 5000 nm.

In the specific embodiment illustrated in the drawings of the present disclosure, the resultant first Group III nitride material structure 24 comprises a merged product of Group III nitride material 22L, 22M, 22R and has a planar uppermost surface 28 and a corrugated bottommost surface 30 opposing the planar uppermost surface 28. In accordance with the present disclosure, and as also shown in FIG. 5, the corrugated bottommost surface 30 of the first Group III nitride material structure 24 includes at least two non-indented portions 32, and has an indented portion 34L, 34R located between the at least two non-indented portions 32.

As is shown in FIG. 5, each non-indented portion 32 of the first Group III nitride material structure 24 is in direct contact with a first horizontal portion of the buffer layer 20 that is located atop the mesa surface portion 14 of the patterned substrate 12. In some embodiments (not shown), and when no buffer layer 20 is employed, each non-indented portion 32 of the first Group III nitride material structure 24 is in direct contact with the mesa surface portion 14 of the patterned substrate 12. As is also shown in FIG. 5, each indented portion 34L, 34R of the first Group III nitride material structure 24 has a center portion CP that is located over a portion of each of the at least one recessed openings 16. The angle from the CP to a sidewall edge of one of the mesa surface portions 14 is typically from 10° to 20° however under different aspect ratios and reactor conditions, this could vary.

The second Group III nitride material structure 26 that is formed atop recessed surface 18 in the at least one recessed opening 16 has a bottommost surface that can be in direct contact with either a horizontal portion of the buffer layer 20 in the at least one recessed opening 16, or within the recessed surface 18.

Figure 6:
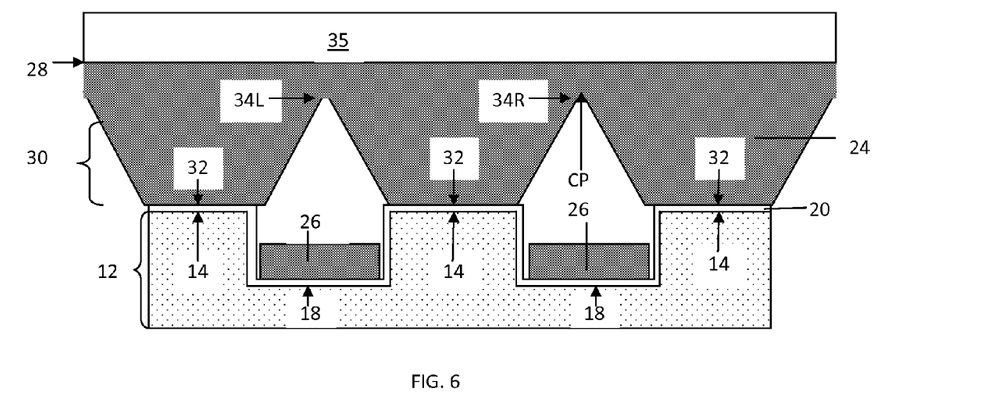
FIG. 6 is a pictorial representation (through a cross sectional view) illustrating the structure of FIG. 5 after forming at least one semiconductor device on an exposed planar uppermost surface of the first Group III nitride material structure.

Referring now to FIG. 6, there is illustrated the structure of FIG. 5 after forming at least one semiconductor device 35 on an exposed planar uppermost surface 28 of the first Group III nitride material structure 24. The at least one semiconductor device 35 that can be formed on the exposed planar uppermost surface 28 of the first Group III nitride material structure 24 includes for example, field effect transistors (FET), photonic devices (i.e., light emitting diodes or laser diodes) and combinations thereof.

The at least one semiconductor device 35 can be formed using conventional processes that are well known to those skilled in the art. In some embodiments, the at least one semiconductor device 35 can be formed upon and within the exposed planar uppermost surface 28 of the first Group III nitride material structure 24. When FETs are formed upon and within the exposed planar uppermost surface 28 of the first Group III nitride material structure 24, a portion of the first Group III nitride material structure 24 can serve as a device channel and a gate stack including at least a gate dielectric material and gate electrode can be formed above the device channel utilizing conventional silicon complementary metal oxide semiconductor (CMOS)-like processes. In some embodiments, interconnect structures can be built atop the FETs that are formed upon and within the exposed planar uppermost surface 28 of the first Group III nitride material structure 24.

In some embodiments, the at least one semiconductor device 35 can comprise an epitaxial layer or a multilayered epitaxial layered stack that is formed upon the exposed planar uppermost surface 28 of the first Group III nitride material structure 24. Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface.

In the present embodiment, the semiconductor material has the same crystalline characteristics as that of the exposed planar uppermost surface 28 of the first Group III nitride material structure 24. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, the epitaxial deposition process is a selective deposition process.

The semiconductor material that can be epitaxially deposited includes any semiconductor material such as, for example, silicon (Si), germanium (Ge), and silicon germanium (SiGe). In one embodiment, the semiconductor material that is epitaxially deposited includes a same semiconductor material as that of the first Group III nitride material structure 24. In another embodiment, the semiconductor material includes a different semiconductor material as that of the first Group III nitride material structure 24. It is noted that the specific material compositions for the semiconductor material are provided for illustrative purposes only, and are not intended to limit the present disclosure, as any semiconductor material that may be formed using an epitaxial growth process.

A number of different sources may be used for the deposition of semiconductor material. In some embodiments, in which the semiconductor material is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane ($(CH_3)SiH_3$), dimethylsilane ($(CH_3)_2SiH_2$), ethylsilane ($(CH_3CH_2)SiH_3$), methyldisilane ($(CH_3)Si_2H_5$), dimethyldisilane ($(CH_3)_2Si_2H_4$), hexamethyldisilane ($(CH_3)_6Si_2$) and combinations thereof. In some embodiments, in which semiconductor material is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The temperature for epitaxial semiconductor deposition typically ranges from 550° C. to 1300° C. The apparatus for performing the epitaxial growth may include a chemical vapor deposition (CVD) apparatus, such as atmospheric pressure CVD (APCVD), low pressure CVD (LPCVD), plasma enhanced CVD (PECVD), metal-organic CVD (MOCVD) and others. The epitaxial semiconductor material that is deposited can be doped or undoped. By "undoped" it is meant that the maximum dopant concentration of p-type or n-type dopants that are present in the epitaxial semiconductor material is less than $5 \times 10^{17}$ atoms/cm$^3$.

Following the epitaxial growth of semiconductor material, a planarization process such as chemical mechanical polishing and/or grinding can be used to provide a planar structure.

In some embodiments, the epitaxial semiconductor material can be grown utilizing a MOCVD process similar to the one mentioned above in forming the first and second Group III nitride material structures.

Figure 7:
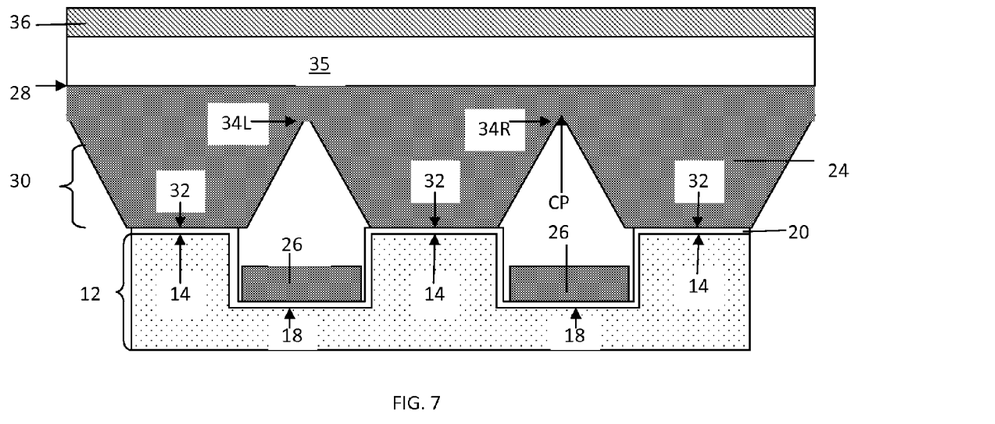
FIG. 7 is a pictorial representation (through a cross sectional view) illustrating the structure of FIG. 6 after bonding an uppermost surface of the at least one semiconductor device to a second substrate.

Referring now to FIG. 7, there is illustrated the structure of FIG. 6 after bonding an uppermost surface of the at least one semiconductor device 35 to a second substrate 36; the second substrate 36 may also be referred to herein as another substrate. The second substrate 36 may comprise a semiconductor material, an insulator material, a conductive material or any combination thereof. In another embodiment, the second substrate 36 comprises a semiconductor substrate such as Si. In one embodiment of the present disclosure, the second substrate 36 may include a heat sink material layer such as, for example, AlN or a high thermal conductive ceramic such as beryllium oxide (BeO). The heat sink material layer can be formed atop a semiconductor substrate and after bonding the semiconductor substrate can be removed to expose an uppermost surface of the heat sink material layer.

Bonding of the second substrate 36 to the uppermost surface of the at least one semiconductor device 35 may include any bonding technique well known to those skilled in the art. Bonding may occur by directly contacting the uppermost surface of the at least one semiconductor device 35 to the second substrate 36, and applying at least an external pressure on the two structures. Bonding may be achieved using a bonding temperature from nominal room temperature (i.e., 20° C. to 30° C.) up to, and including, 1000° C. The external pressure that is exerted on the contacted structures can be unidirection or bidirectional. In some embodiments, an adhesive can be employed to one or both of the second substrate 36 or the uppermost surface of the at least one semiconductor device 35 prior to bonding.

In some embodiments, and after bonding, portions of the second substrate may be removed by utilizing any well known material removing process such as, for example, Epitaxial Lift-Off (ELO), spalling, small cut, etch back, and/or chemical mechanical polishing.

Figure 8:
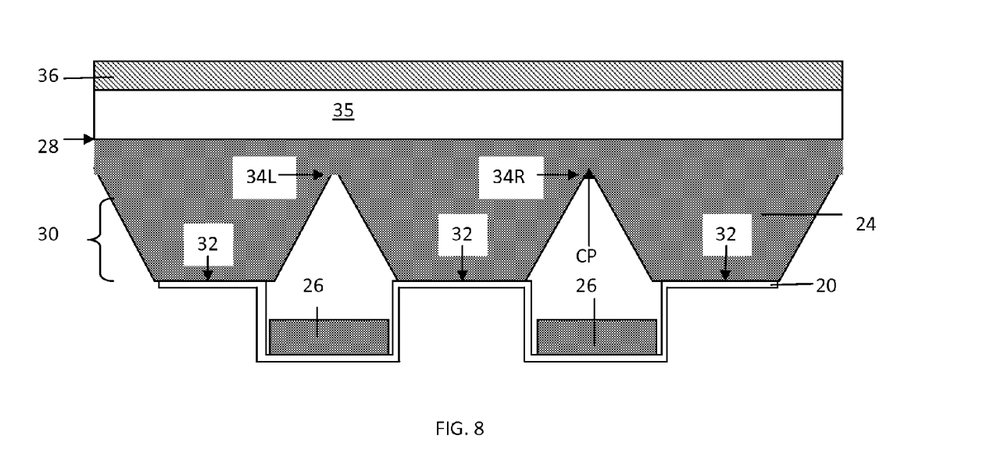
FIG. 8 is a pictorial representation (through a cross sectional view) illustrating the structure of FIG. 7 after removing the patterned substrate from the structure.

Referring now to FIG. 8, there is illustrated the structure of FIG. 7 after removing the patterned substrate 12 from the structure. As is shown in FIG. 8, the second Group III nitride material structure 26 remains attached to the first Group III nitride material structure 24 via the buffer layer 20. The patterned substrate 12 can be removed utilizing an etching process that selectively removes the material of the patterned substrate 12 relative to the buffer layer 20. In one embodiment of the present disclosure, etching in HF:HNO$_3$:CH$_3$COOH (1:1:1) acid mixture can be used to remove the patterned substrate 12 from the structure.

It is noted that in embodiments in which no buffer layer 20 is present, the second Group III nitride material structure 26 would also be removed from the structure that includes the first Group III nitride material structure 24. Also, in such an embodiment, the entirety of the corrugated bottommost surface 30 of the first Group III nitride material structure 24 including the at least two non-indented portions 32, and the indented portions 34L, 34R would be bare at this point of the present disclosure.

Figure 9:
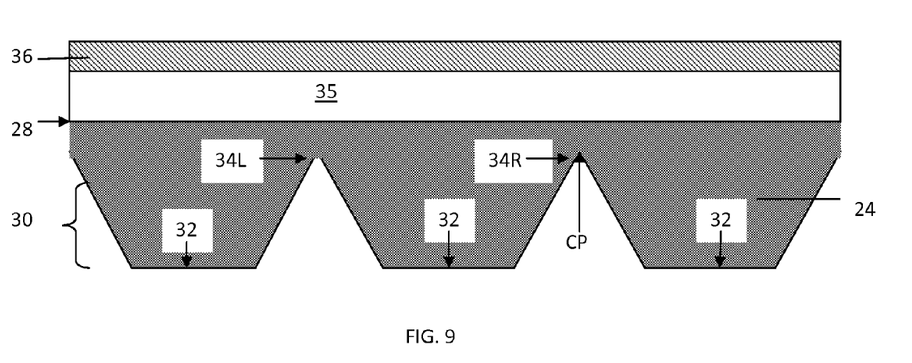
FIG. 9 is a pictorial representation (through a cross sectional view) illustrating the structure of FIG. 8 after removing the buffer layer and the second Group III nitride material structure therefrom.

Referring now to FIG. 9, there is illustrated the structure of FIG. 8 after removing the buffer layer 20 and the second Group III nitride material structure 26 from the structure that includes the first Group III nitride material structure 24. The buffer layer 20 and the second Group III nitride material structure 26 can be removed by utilizing an etch that selectively removes the buffer layer 20 relative to the first Group III nitride material structure 24. In one embodiment, an etch in KOH can be used to remove the buffer layer 20 and the second Group III nitride material structure 26 from the structure that includes the first Group III nitride material structure 24. It is noted that since the second Group III nitride material structure 26 is disjoined from the first Group III nitride material structure 24, removing the buffer layer 20 also removes the second Group III nitride material structure 26 from the structure that includes the first Group III nitride material structure 24.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure, said method comprising:
   providing a patterned substrate comprising at least two mesa surface portions and at least one recessed opening separating the at least two mesa surface portions;
   simultaneously forming a first Group III nitride material structure and a second Group III nitride material structure, wherein said first Group III nitride material structure is formed atop the at least two mesa surface portions of the patterned substrate and spans across the at least one recessed opening, and said second Group III nitride material structure is formed entirely in the at least one recessed opening, and is disjoined from said first Group III nitride material structure, and is atop a recessed surface of the patterned substrate;
   forming at least one semiconductor device on an exposed planar uppermost surface of the first Group III nitride material structure;
   bonding an uppermost surface of the at least one semiconductor device to another substrate;
   removing the patterned substrate that is present beneath said first Group III nitride material structure; and
   removing the second Group III nitride material structure that is present beneath the first Group III nitride material structure.

2. The method of claim 1, wherein said patterned substrate comprises (111) Si, sapphire, SiC, a Group III nitride layer, or multilayered combinations thereof.

3. The method of claim 1, wherein said providing a patterned substrate comprises lithography and etching.

4. The method of claim 1, wherein said at least one recessed opening has an aspect ratio from 1 to 100.

5. The method of claim 1, further comprising forming a contiguous Group III nitride buffer layer on the exposed surfaces of the patterned substrate.

6. The method of claim 5, wherein said forming the contiguous Group III nitride buffer layer comprises introducing an organo-Group III element containing precursor and a nitride precursor into a reactor including said patterned substrate and depositing said precursors at a temperature of 500° C. or greater.

7. The method of claim 1, further comprising heating the patterned substrate in an atmosphere of hydrogen and prealuminizing the exposed surfaces of the patterned substrate prior to forming the first and second Group III nitride material structures.

8. The method of claim 7, further comprising forming a contiguous AlN buffer layer on exposed surfaces of said patterned substrate, wherein said forming the contiguous AlN buffer layer comprises introducing an organoaluminum precursor and a nitride precursor and depositing said precursors at a temperature of 500° C. or greater.

9. The method of claim 1, wherein said simultaneously forming said first Group III nitride material structure and said second Group III nitride material structure comprises metalorganic chemical vapor deposition (MOCVD), and said MOCVD is performed at a temperature from 750° C. or greater.

10. The method of claim 1, wherein said first Group III nitride material structure has a planar uppermost surface and a corrugated bottommost surface.

11. A method of forming a semiconductor structure, said method comprising:
providing a patterned substrate comprising at least two mesa surface portions and at least one recessed opening separating the at least two mesa surface portions;
forming a buffer layer on exposed surfaces of the patterned substrate;
simultaneously forming a first Group III nitride material structure and a second Group III nitride material structure, wherein said first Group III nitride material structure is formed atop the at least two mesa surface portions of the patterned substrate and spans across the at least one recessed opening, and said second Group III nitride material structure is formed entirely in the at least one recessed opening, and is disjoined from said first Group III nitride material structure, and is atop a recessed surface of the patterned substrate
forming at least one semiconductor device on an exposed planar uppermost surface of the first Group III nitride material structure;
bonding an uppermost surface of the at least one semiconductor device to another substrate;
removing the patterned substrate that is present beneath said first Group III nitride material structure; and
removing the buffer layer and the second Group III nitride material structure that is present beneath the first Group III nitride material structure.

12. The method of claim 11, wherein said patterned substrate comprises (111) Si, sapphire, SiC, a Group III nitride layer, or multilayered combinations thereof.

13. The method of claim 11, wherein said providing the patterned substrate comprises lithography and etching.

14. The method of claim 11, wherein said at least one recessed opening has an aspect ratio from 1 to 100.

15. The method of claim 11, further comprising forming a contiguous Group III nitride buffer layer on the exposed surfaces of the patterned substrate.

16. The method of claim 15, wherein said forming the contiguous Group III nitride buffer layer comprises introducing an organo-Group III element containing precursor and a nitride precursor into a reactor including said patterned substrate and depositing said precursors at a temperature of 500° C. or greater.

17. The method of claim 11, further comprising heating the patterned substrate in an atmosphere of hydrogen and prealuminizing the exposed surfaces of the patterned substrate prior to forming the first and second Group III nitride material structures.

18. The method of claim 17, further comprising forming a contiguous AlN buffer layer on exposed surfaces of said patterned substrate, wherein said forming the contiguous AlN buffer layer comprises introducing an organoaluminum precursor and a nitride precursor and depositing said precursors at a temperature of 500° C. or greater.

19. The method of claim 11, wherein said simultaneously forming said first Group III nitride material structure and said second Group III nitride material structure comprises metalorganic chemical vapor deposition (MOCVD), and said MOCVD is performed at a temperature from 750° C. or greater.

20. The method of claim 11, wherein said first Group III nitride material structure has a planar uppermost surface and a corrugated bottommost surface.

* * * * *